United States Patent
Zhang et al.

(10) Patent No.: US 11,114,468 B2
(45) Date of Patent: Sep. 7, 2021

(54) THIN FILM TRANSISTOR ARRAY SUBSTRATE

(71) Applicant: WUHAN CHINA STAR OPTOELECTRONICS TECHNOLOGY CO., LTD., Wuhan (CN)

(72) Inventors: Xin Zhang, Wuhan (CN); Lisheng Li, Wuhan (CN); Peng He, Wuhan (CN)

(*) Notice: Subject to any disclaimer, the term of this patent is extended or adjusted under 35 U.S.C. 154(b) by 189 days.

(21) Appl. No.: 16/475,137

(22) PCT Filed: Mar. 25, 2019

(86) PCT No.: PCT/CN2019/079416
§ 371 (c)(1),
(2) Date: Jul. 1, 2019

(87) PCT Pub. No.: WO2020/133747
PCT Pub. Date: Jul. 2, 2020

(65) Prior Publication Data
US 2020/0251503 A1 Aug. 6, 2020

(30) Foreign Application Priority Data
Dec. 29, 2018 (CN) .......................... 201811647150.6

(51) Int. Cl.
*H01L 27/12* (2006.01)
*H01L 29/423* (2006.01)

(52) U.S. Cl.
CPC .... *H01L 27/1222* (2013.01); *H01L 29/42384* (2013.01)

(58) Field of Classification Search
CPC .......... H01L 27/1222; H01L 29/78675; H01L 29/78621; H01L 29/78627; H01L 29/78696
See application file for complete search history.

(56) References Cited

U.S. PATENT DOCUMENTS

| | | | |
|---|---|---|---|
| 6,025,607 A * | 2/2000 | Ohori | ................ H01L 29/66757 257/72 |
| 2005/0003591 A1* | 1/2005 | Takaoka | .............. H01L 21/2026 438/151 |
| 2007/0262314 A1* | 11/2007 | Noguchi | ........... H01L 29/78645 257/72 |
| 2017/0005152 A1 | 1/2017 | Hong et al. | |
| 2017/0025439 A1* | 1/2017 | I | ............................ H01L 27/1222 |
| 2018/0182785 A1* | 6/2018 | Chen | .................. H01L 21/02502 |
| 2018/0364503 A1* | 12/2018 | Chen | .................. H01L 29/78606 |
| 2019/0214485 A1 | 7/2019 | Wang et al. | |
| 2019/0371827 A1* | 12/2019 | Lai | .................... H01L 29/78675 |

(Continued)

FOREIGN PATENT DOCUMENTS

| | | |
|---|---|---|
| CN | 103346093 A | 10/2013 |
| CN | 106128963 A | 11/2016 |
| CN | 106328689 A | 1/2017 |

(Continued)

*Primary Examiner* — Cuong Q Nguyen
*Assistant Examiner* — Peter M Albrecht

(57) ABSTRACT

A thin film transistor (TFT) array substrate is provided. The TFT array substrate includes a display device plate and a semiconductor layer disposed on the display device plate. A thickness of the semiconductor layer is less than or equal to 35 nm.

16 Claims, 4 Drawing Sheets

(56) References Cited

U.S. PATENT DOCUMENTS

2019/0378931 A1* 12/2019 Tian .................. H01L 29/78633

FOREIGN PATENT DOCUMENTS

| CN | 106505071 A | | 3/2017 |
|----|-------------|---|--------|
| CN | 206003775 U | | 3/2017 |
| CN | 206628473 U | * | 11/2017 |
| CN | 206628473 U | | 11/2017 |
| CN | 108417580 A | | 8/2018 |
| KR | 20150144060 A | * | 12/2015 |

* cited by examiner

THIN FILM TRANSISTOR ARRAY SUBSTRATE

FIELD OF INVENTION

The present disclosure relates to display technologies, and more particularly, to a thin film transistor (TFT) array substrate.

BACKGROUND OF INVENTION

A flat display device such as a liquid crystal display (LCD) has become a mainstream display device because of its high image quality, power saving, thin body, and wide application range. In particular, due to its higher carrier mobility, low temperature polysilicon (LTPS) display technology can achieve higher on/off ratio of current of thin film transistors, improve panel aperture ratio, improve panel brightness and high resolution, and reduce panel power consumption so as to provide a better visual experience.

Because the liquid crystal display is a passive display device that adjusts an alignment state of liquid crystal molecules by an electric field to realize luminous flux modulation, a fine active driving array is required to cooperate with the liquid crystal molecules in deflection state of each pixel. In view of development of the low-temperature polysilicon active array toward an ever-shrinking feature size, in order to reduce the production cost and cycle of the low-temperature polysilicon array substrate, there has been developed a technology where a light-shielding (LS) mask is omitted in process.

However, without the LS mask in process, photogenerated carriers in the thin film transistor (TFT) are increased to result in an increase in photo-generated leakage current ($I_{off}$), and result in an increase in panel power consumption.

Therefore, there is a need to solve the above problems.

SUMMARY OF INVENTION

In view of the above, the present disclosure provides a thin film transistor (TFT) array substrate to resolve above-mentioned technical problem.

In order to achieve above-mentioned object of the present disclosure, one embodiment of the disclosure provides a TFT array substrate including a display device plate and a semiconductor layer disposed on the display device plate.

A thickness of the semiconductor layer is less than or equal to 35 nm, and the semiconductor layer is generally "n" shaped.

In one embodiment of the disclosure, the semiconductor layer includes an active island and semiconductor lines connected to the active island and perpendicularly disposed to the active island. A width of the active island is less than or equal to 1.8 μm.

In one embodiment of the disclosure, the semiconductor lines include ion lightly doped areas and channel connecting areas. A width of the ion lightly doped area is less than the width of the active island.

In one embodiment of the disclosure, a width of the channel connecting area is equal to the width of the active island.

In one embodiment of the disclosure, a width of the channel connecting area is less than the width of the active island.

In one embodiment of the disclosure, the width of the ion lightly doped area is equal to the width of the channel connecting area.

In one embodiment of the disclosure, the width of the ion lightly doped area is less than the width of the channel connecting area.

In one embodiment of the disclosure, the display device plate includes:
  a base substrate;
  a buffer layer disposed on the base substrate;
  a gate insulated layer disposed on the buffer layer;
  a gate metallic layer disposed on the gate insulated layer;
  an interlayer dielectric disposed on the gate insulated layer and covering the gate metallic layer; and
  a source/drain metallic layer disposed on the interlayer dielectric.

The semiconductor layer is disposed on the buffer layer and covered by the gate insulated layer. The semiconductor lines further include bonding areas. The source/drain metallic layer is connected to the bonding areas.

In one embodiment of the disclosure, a width of the bonding area is greater than the width of the active island.

In one embodiment of the disclosure, a width of the gate metallic layer is greater than a length of the channel connecting area.

Furthermore, another embodiment of the disclosure provides a TFT array substrate including a display device plate and a semiconductor layer disposed on the display device plate. A thickness of the semiconductor layer is less than or equal to 35 nm.

In one embodiment of the disclosure, the semiconductor layer includes an active island and semiconductor lines connected to the active island and perpendicularly disposed to the active island. A width of the active island is less than or equal to 1.8 μm.

In one embodiment of the disclosure, the semiconductor lines include ion lightly doped areas and channel connecting areas. A width of the ion lightly doped area is less than the width of the active island.

In one embodiment of the disclosure, a width of the channel connecting area is equal to the width of the active island.

In one embodiment of the disclosure, a width of the channel connecting area is less than the width of the active island.

In one embodiment of the disclosure, the width of the ion lightly doped area is equal to the width of the channel connecting area.

In one embodiment of the disclosure, the width of the ion lightly doped area is less than the width of the channel connecting area.

In one embodiment of the disclosure, the display device plate includes:
  a base substrate;
  a buffer layer disposed on the base substrate;
  a gate insulated layer disposed on the buffer layer;
  a gate metallic layer disposed on the gate insulated layer;
  an interlayer dielectric disposed on the gate insulated layer and covering the gate metallic layer; and
  a source/drain metallic layer disposed on the interlayer dielectric.

The semiconductor layer is disposed on the buffer layer and covered by the gate insulated layer. The semiconductor lines further include bonding areas. The source/drain metallic layer is connected to the bonding areas.

In one embodiment of the disclosure, a width of the bonding area is greater than the width of the active island.

In one embodiment of the disclosure, a width of the gate metallic layer is greater than a length of the channel connecting area.

In comparison with prior art based on the technology that omitted a light-shielding layer to reduce the production cost and cycle of the TFT array substrate, the disclosure reduces photogenerated carriers then reduces photo-generated leakage current of backlight and decreases panel power consumption by reducing the thickness of the semiconductor layer, the width of the active island, and the width of the ion lightly doped area.

Reference numbers of the present disclosure are as follows:

10: base substrate, 20: buffer layer, 30: gate insulated layer, 40: gate metallic layer, 50: interlayer dielectric, 61: source electrode, 62: drain electrode, 70: semiconductor layer, 71: active island, 72: ion lightly doped area, 73: channel connecting area, 74: bonding area.

DETAILED DESCRIPTION OF PREFERRED EMBODIMENTS

The following description of the embodiments is provided by reference to the following drawings and illustrates the specific embodiments of the present disclosure. Directional terms mentioned in the present disclosure, such as "up," "down," "top," "bottom," "forward," "backward," "left," "right," "inside," "outside," "side," "peripheral," "central," "horizontal," "peripheral," "vertical," "longitudinal," "axial," "radial," "uppermost" or "lowermost," etc., are merely indicated the direction of the drawings. Therefore, the directional terms are used for illustrating and understanding of the application rather than limiting thereof.

The disclosure resolves a problem of TFT array substrate that increase in panel power consumption resulting from increasing of photogenerated carriers when light-shielding layer is omitted.

Embodiment One

Figure 1:
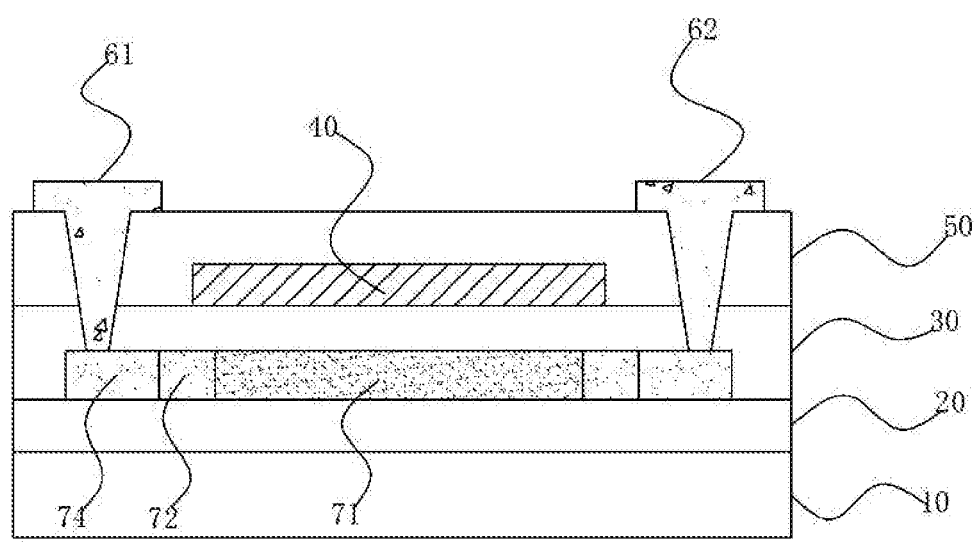
FIG. 1 is schematic view of a thin film transistor array substrate according to an embodiment of the present disclosure.

Referring to FIG. 1, a TFT array substrate includes a display device plate and a semiconductor layer 70 disposed on the display device plate.

A thickness of the semiconductor layer 70 is less than or equal to 35 nm. In another embodiment, the thickness of the semiconductor layer 70 is 30 nm.

In detail, the display device plate includes a base substrate 10, a buffer layer 20 disposed on the base substrate 10, a gate insulated layer 30 disposed on the buffer layer 20, a gate metallic layer 40 disposed on the gate insulated layer 30, an interlayer dielectric 50 disposed on the gate insulated layer 30 and covering the gate metallic layer 40, and a source/drain metallic layer disposed on the interlayer dielectric 50 and connected to the semiconductor layer 70.

The semiconductor layer 70 is disposed on the buffer layer 20 and covered by the gate insulated layer 30.

Based on the technology that omitted a light-shielding layer for the sake of reducing the production cost and cycle of the TFT array substrate, the disclosure reduces a volume of the semiconductor layer 70 exposed to light by reducing its thickness, then photo-generated carriers are reduced, photo-generated leakage current of backlight is reduced, and panel power consumption is decreased.

Figure 2:
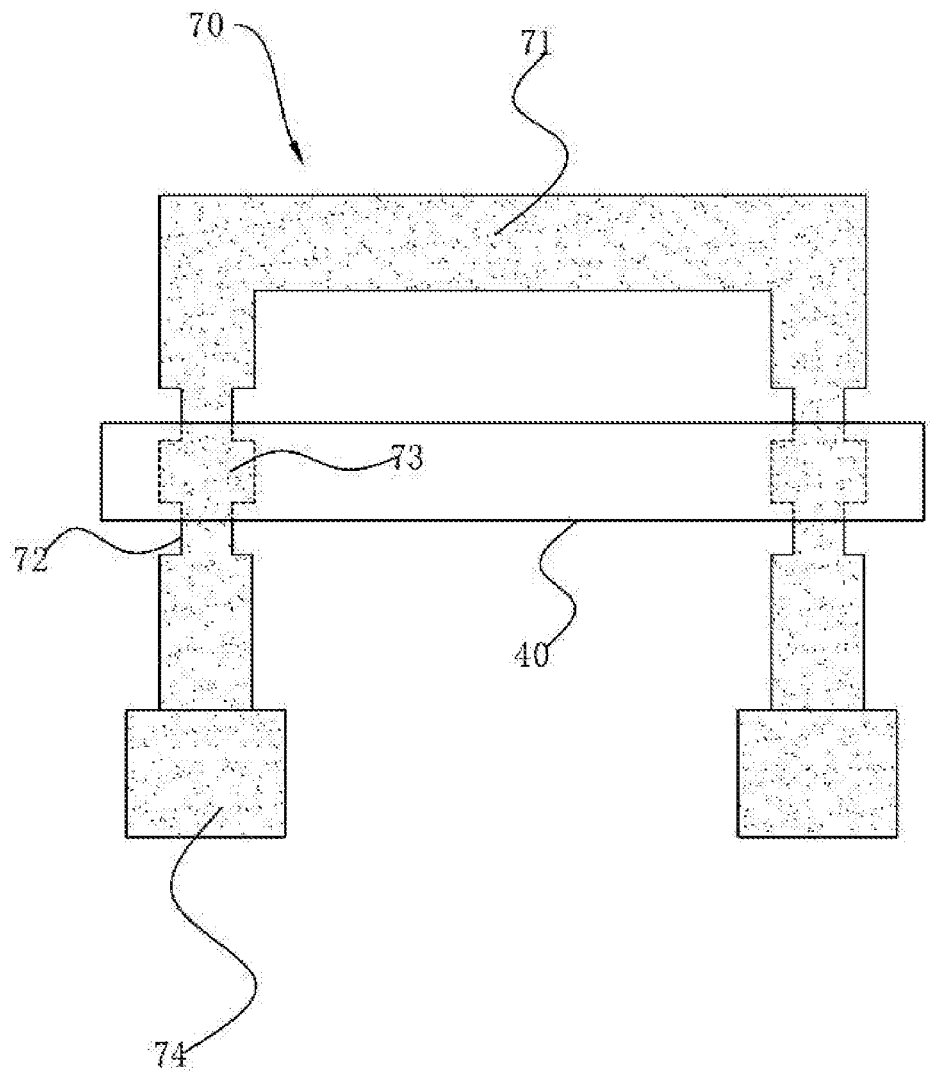
FIG. 2 is a schematic view of a structure of a semiconductor layer and a gate metallic layer according to a first embodiment of the present disclosure.

Referring to FIG. 2, the semiconductor layer 70 is generally "n" shaped. The semiconductor layer 70 includes an active island 71 and semiconductor lines connected to the active island 71 and perpendicularly disposed to the active island 71. A width of the active island 71 is less than or equal to 1.8 μm.

The disclosure reduces a volume exposed to light by reducing a width of the semiconductor layer 70 then the photo-generated leakage current of backlight is reduced and the panel power consumption is decreased.

It has been confirmed in experience that photo-generated leakage current drops substantially to a related low level when the width of the active island 71 is less than or equal to 1.8 μm, and the thickness of the semiconductor layer 70 is less than or equal to 35 nm.

In one embodiment of the disclosure, the width of the active island is 1.5 μm.

In detail, the semiconductor lines include ion lightly doped areas 72 and channel connecting areas 73. A width of the channel connecting area 73 is equal to the width of the active island 71. A width of the ion lightly doped area 72 is less than the width of the active island 71.

The disclosure further decreases the photo-generated leakage current of backlight by reducing the width of the ion lightly doped area 72.

In one embodiment of the disclosure, a width of the gate metallic layer 40 is greater than a length of the channel connecting area 73. That is to say, a width of the channel is greater than the length of the channel connecting area 73 to increase charging rate of TFT.

In detail, the semiconductor lines further include bonding areas 74. The source/drain metallic layer includes a source electrode 61 connected to the bonding area, and a drain electrode 62 connected to the bonding area.

In one embodiment of the disclosure, a width of the bonding area 74 is greater than the width of the active island 71 for easily contacting between the source electrode 61 and the semiconductor layer 70, and between the drain electrode 62 and the semiconductor layer 70 to reduce process difficulty in display panel producing.

Embodiment Two

Figure 3:
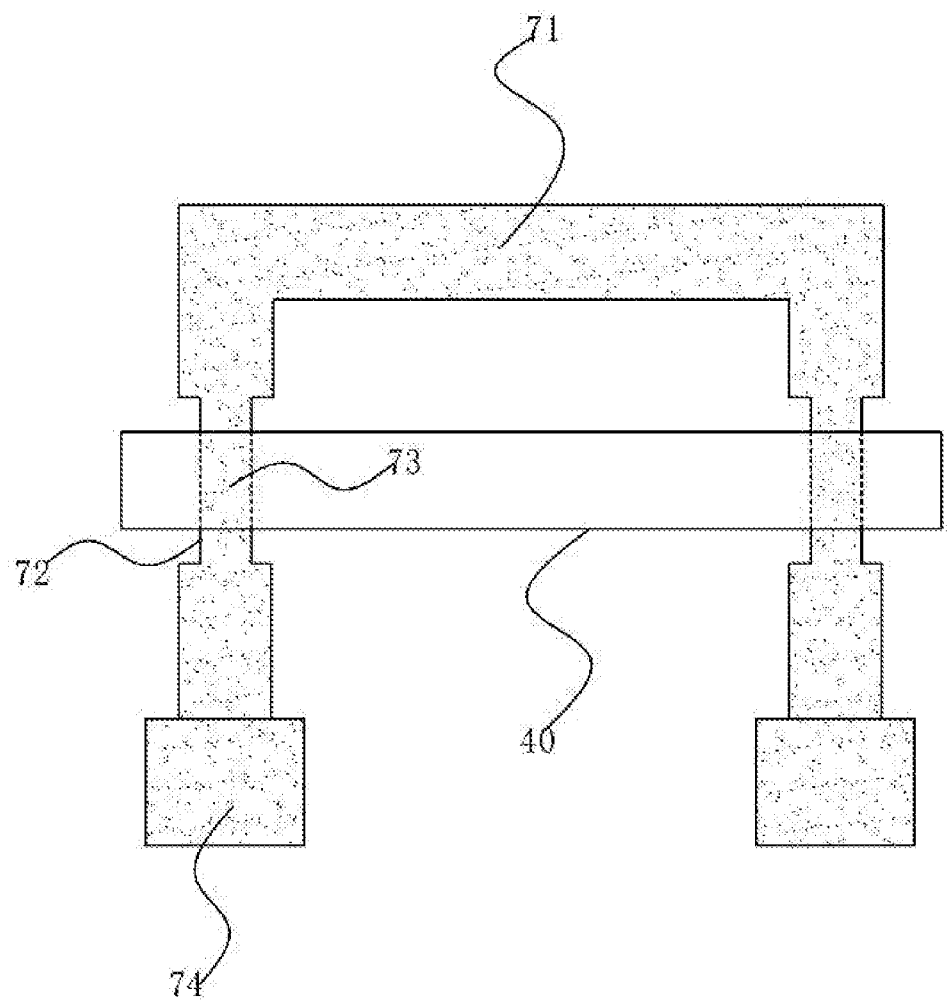
FIG. 3 is a schematic view of a structure of a semiconductor layer and a gate metallic layer according to a second embodiment of the present disclosure.

Referring to FIG. 3, a TFT array substrate includes a channel connecting area 73 with a width different from that in embodiment one.

In detail, the width of the channel connecting area 73 is less than the width of the active island 71. The width of the ion lightly doped area 72 is equal to the width of the channel connecting area 73.

Embodiment Three

Figure 4:
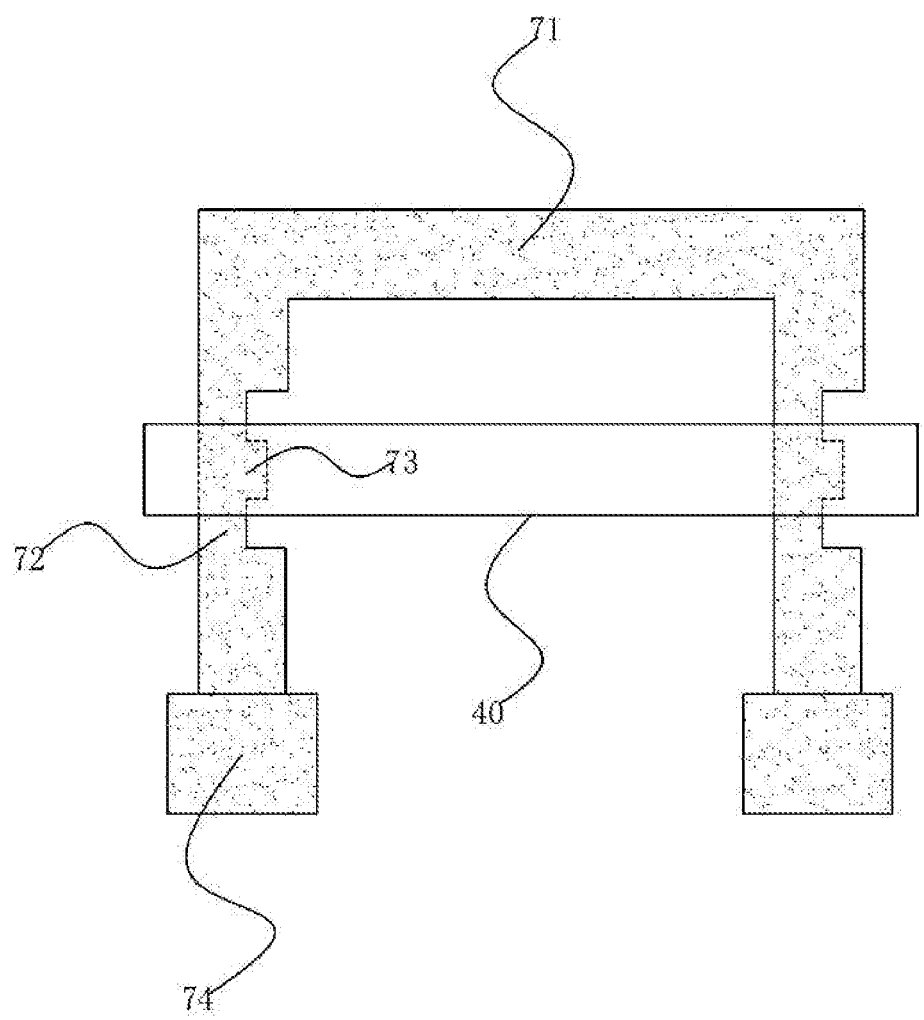
FIG. 4 is a schematic view of a structure of a semiconductor layer and a gate metallic layer according to a third embodiment of the present disclosure.

Referring to FIG. 4, a TFT array substrate includes a ion lightly doped area 72 with a width different from that in embodiment two.

In detail, the width of the ion lightly doped area 72 is less than the width of the channel connecting area 73.

In comparison with prior art based on the technology that omitted a light-shielding layer to reduce the production cost and cycle of the TFT array substrate, the disclosure reduces photogenerated carriers then reduces photo-generated leakage current of backlight and decreases the panel power consumption by reducing the thickness of the semiconductor layer 70, the width of the active island 71, and the width of the ion lightly doped area 72.

The present disclosure has been described by the above embodiments, but the embodiments are merely examples for implementing the present disclosure. It must be noted that the embodiments do not limit the scope of the invention. In contrast, modifications and equivalent arrangements are intended to be included within the scope of the invention.

What is claimed is:

1. A thin film transistor (TFT) array substrate, comprising:
   a display device plate; and
   a semiconductor layer disposed on the display device plate, wherein a thickness of the semiconductor layer is less than or equal to 35 nm, and the semiconductor layer is generally "n" shaped;
   wherein the semiconductor layer comprises an active island and semiconductor lines connected to the active island and perpendicularly disposed to the active island, a width of the active island is less than or equal to 1.8 µm; and
   wherein the semiconductor lines comprise ion lightly doped areas and channel connecting areas, and a width of the ion lightly doped area is less than the width of the active island.

2. The TFT array substrate according to claim 1, wherein a width of the channel connecting area is equal to the width of the active island.

3. The TFT array substrate according to claim 1, wherein a width of the channel connecting area is less than the width of the active island.

4. The TFT array substrate according to claim 3, wherein the width of the ion lightly doped area is equal to the width of the channel connecting area.

5. The TFT array substrate according to claim 3, wherein the width of the ion lightly doped area is less than the width of the channel connecting area.

6. The TFT array substrate according to claim 1, wherein the display device plate comprises:
   a base substrate;
   a buffer layer disposed on the base substrate;
   a gate insulated layer disposed on the buffer layer;
   a gate metallic layer disposed on the gate insulated layer;
   an interlayer dielectric disposed on the gate insulated layer and covering the gate metallic layer; and
   a source/drain metallic layer disposed on the interlayer dielectric, wherein the semiconductor layer is disposed on the buffer layer and covered by the gate insulated layer, the semiconductor lines further comprise bonding areas, and the source/drain metallic layer is connected to the bonding areas.

7. The TFT array substrate according to claim 6, wherein a width of the bonding area is greater than the width of the active island.

8. The TFT array substrate according to claim 6, wherein a width of the gate metallic layer is greater than a length of the channel connecting area.

9. A TFT array substrate, comprising:
   a display device plate; and
   a semiconductor layer disposed on the display device plate, wherein a thickness of the semiconductor layer is less than or equal to 35 nm;
   wherein the semiconductor layer comprises an active island and semiconductor lines connected to the active island and perpendicularly disposed to the active island, a width of the active island is less than or equal to 1.8 µm; and
   wherein the semiconductor lines comprise ion lightly doped areas and channel connecting areas, and a width of the ion lightly doped area is less than the width of the active island.

10. The TFT array substrate according to claim 9, wherein a width of the channel connecting area is equal to the width of the active island.

11. The TFT array substrate according to claim 9, wherein a width of the channel connecting area is less than the width of the active island.

12. The TFT array substrate according to claim 11, wherein the width of the ion lightly doped area is equal to the width of the channel connecting area.

13. The TFT array substrate according to claim 11, wherein the width of the ion lightly doped area is less than the width of the channel connecting area.

14. The TFT array substrate according to claim 9, wherein the display device plate comprises:
   a base substrate;
   a buffer layer disposed on the base substrate;
   a gate insulated layer disposed on the buffer layer;
   a gate metallic layer disposed on the gate insulated layer;
   an interlayer dielectric disposed on the gate insulated layer and covering the gate metallic layer; and
   a source/drain metallic layer disposed on the interlayer dielectric, wherein the semiconductor layer is disposed on the buffer layer and covered by the gate insulated layer, the semiconductor lines further comprise bonding areas, and the source/drain metallic layer is connected to the bonding areas.

15. The TFT array substrate according to claim 14, wherein a width of the bonding area is greater than the width of the active island.

16. The TFT array substrate according to claim 14, wherein a width of the gate metallic layer is greater than a length of the channel connecting area.

* * * * *